United States Patent
Nozawa

(10) Patent No.: US 11,090,927 B2
(45) Date of Patent: Aug. 17, 2021

(54) DRIVING CIRCUIT AND LIQUID EJECTION APPARATUS

(71) Applicant: SEIKO EPSON CORPORATION, Tokyo (JP)

(72) Inventor: Dai Nozawa, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 2 days.

(21) Appl. No.: 16/801,377

(22) Filed: Feb. 26, 2020

(65) Prior Publication Data

US 2020/0269571 A1  Aug. 27, 2020

(30) Foreign Application Priority Data

Feb. 27, 2019  (JP) ............................ JP2019-033845

(51) Int. Cl.
*B41J 2/045* (2006.01)
*H03F 3/217* (2006.01)

(52) U.S. Cl.
CPC ......... *B41J 2/04541* (2013.01); *B41J 2/0452* (2013.01); *B41J 2/0459* (2013.01); *H03F 3/217* (2013.01)

(58) Field of Classification Search
CPC .................................................... B41J 2/0451
See application file for complete search history.

(56) References Cited

U.S. PATENT DOCUMENTS

| 2005/0218988 A1* | 10/2005 | Berkhout ............. H03F 3/2171 330/269 |
| 2006/0006432 A1* | 1/2006 | Shiraishi ............. H02M 3/1588 257/288 |
| 2015/0084691 A1* | 3/2015 | Hori ..................... H03K 17/687 330/251 |
| 2016/0144617 A1 | 5/2016 | Yamada |

FOREIGN PATENT DOCUMENTS

| JP | 5407940 B2 | 2/2014 |
| JP | 2016-097614 A | 5/2016 |

* cited by examiner

*Primary Examiner* — Shelby L Fidler
(74) *Attorney, Agent, or Firm* — Oliff PLC

(57) ABSTRACT

A driving circuit generating a driving signal, includes a modulator generating a modulated signal by performing pulse modulation on a signal specifying a waveform of the driving signal, an amplifier generating an amplified signal by amplifying the modulated signal, and a smoothing section generating the driving signal by smoothing the amplified signal. The amplifier includes first and second transistors coupled in series between a voltage line to which a voltage which is higher than a ground voltage is supplied and a grounding conductor to which the ground voltage is supplied, and a third transistor having a drain electrode coupled to a gate electrode of the second transistor and a source electrode coupled to the grounding conductor. The first and second transistors are exclusively set to an On state in accordance with the modulated signal, and the amplified signal is output from a node which couples the first and second transistors.

10 Claims, 9 Drawing Sheets

FIG. 6

| | SI (b1, b2) | Ts1 | | Ts2 | |
|---|---|---|---|---|---|
| | | SLa | SLb | SLa | SLb |
| LARGE DOT | (1, 1) | H | L | H | L |
| MEDIUM DOT | (1, 0) | H | L | L | H |
| SMALL DOT | (0, 1) | L | H | H | L |
| NON-RECORDING | (0, 0) | L | H | L | H |

DRIVING CIRCUIT AND LIQUID EJECTION APPARATUS

The present application is based on, and claims priority from JP Application Serial Number 2019-033845, filed Feb. 27, 2019, the disclosure of which is hereby incorporated by reference herein in its entirety.

BACKGROUND

1. Technical Field

The present disclosure relates to a driving circuit and a liquid ejection apparatus.

2. Related Art

JP-A-2016-97614 discloses a driving circuit which drives a piezoelectric element included in a liquid ejection apparatus, such as an ink jet printer, which prints an image by ejecting ink. Such a driving circuit includes first and second transistors which are coupled to each other in series, for example. A source electrode of the second transistor is coupled to a grounding conductor to which a ground voltage is supplied.

The driving circuit performs switching between the first and second transistors so as to generate a pulse signal at a coupling point between the first and second transistors. When the first transistor is turned on, a voltage of a drain electrode of the second transistor which is the coupling point between the first and second transistors is changed from a low level to a high level. When the voltage of the drain electrode of the second transistor is dramatically changed, current is supplied to a parasitic capacitance of the second transistor, and therefore, a voltage of a gate electrode of the second transistor may become equal to or larger than a threshold voltage of the second transistor. In this case, the second transistor is unintentionally turned on and through-current is supplied to the second transistor. Therefore, power consumption of the driving circuit is increased.

SUMMARY

According to an aspect of the present disclosure, a driving circuit generating a driving signal for driving an ejection section which ejects liquid includes a modulator generating a modulated signal by performing pulse modulation on a signal specifying a waveform of the driving signal, an amplifier generating an amplified signal by amplifying the modulated signal, and a smoothing section generating the driving signal by smoothing the amplified signal. The amplifier includes first and second transistors coupled to each other in series between a voltage line to which a voltage which is higher than a ground voltage is supplied and a grounding conductor to which the ground voltage is supplied, and a third transistor having a drain electrode coupled to a gate electrode of the second transistor and a source electrode coupled to the grounding conductor. The first and second transistors are exclusively set to an On state in accordance with the modulated signal, and the amplified signal is output from a node which couples the first and second transistors to each other.

According to another aspect of the present disclosure, a driving circuit includes first and second transistors coupled to each other in series between a voltage line to which a voltage which is higher than a ground voltage is supplied and a grounding conductor to which the ground voltage is supplied and a third transistor having a drain electrode coupled to a gate electrode of the second transistor and a source electrode coupled to the grounding conductor. The first and second transistors are exclusively set to an On state in accordance with an input signal, and a signal is output from a node which couples the first and second transistors to each other.

BRIEF DESCRIPTION OF THE DRAWINGS

FIG. 6 is a diagram illustrating content of decoding performed by a decoder.

DESCRIPTION OF EXEMPLARY EMBODIMENTS

Figure 1:
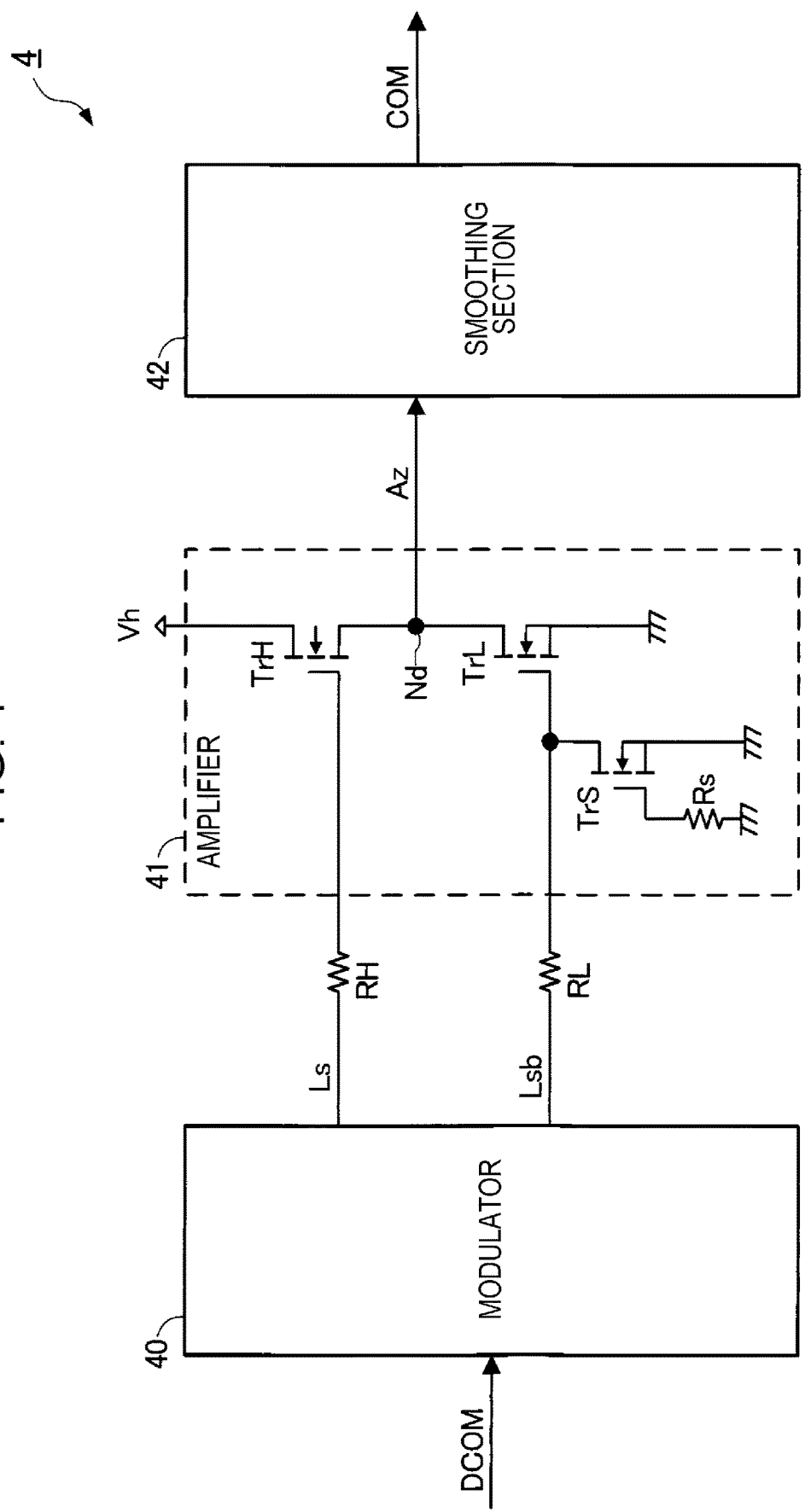
FIG. 1 is a block diagram illustrating an example of a configuration of a driving signal generation circuit according to the present disclosure.

Hereinafter, an embodiment of the present disclosure will be described with reference to the accompanying drawings. Note that, in the drawings, sizes and scales of individual sections are different from actual ones where appropriate. Furthermore, various restrictions which are technically preferable are made in the embodiment below since the embodiment is a preferred concrete example of the present disclosure. However, the scope of the present disclosure is not limited to the embodiment unless descriptions indicating restriction of the present disclosure are particularly made hereinafter.

In this embodiment, a liquid ejection apparatus will be described taking an ink jet printer which forms an image by ejecting ink on a recording sheet as an example. Note that the ink is an example of "liquid" in this embodiment. First, a configuration of a driving signal generation circuit 4 according to this embodiment will be described with reference to FIG. 1.

Figure 8:
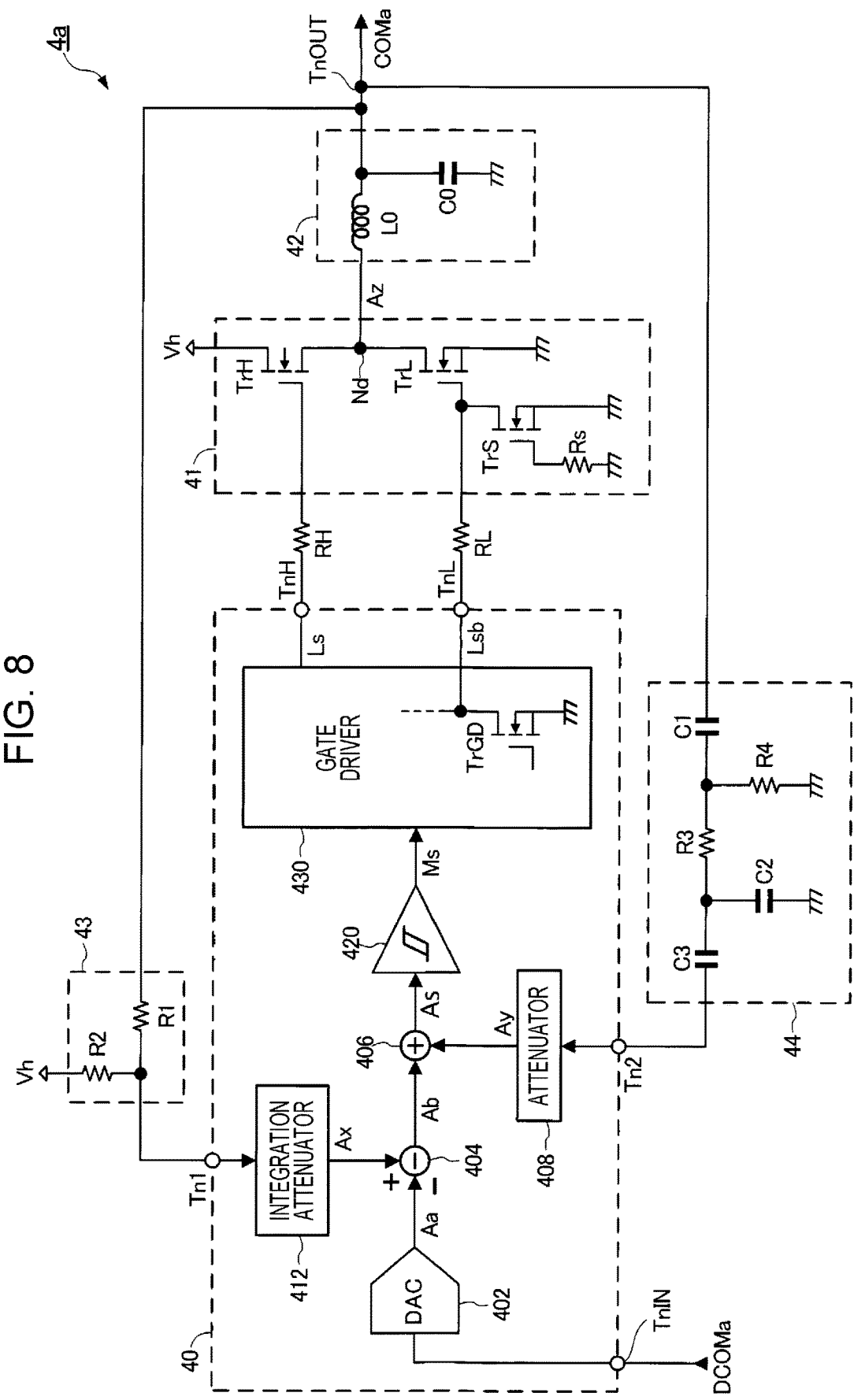
FIG. 8 is a diagram illustrating a configuration of a driving signal generation circuit.

FIG. 1 is a block diagram illustrating an example of a configuration of the driving signal generation circuit 4 according to the present disclosure. The driving signal generation circuit 4 generates a driving signal COM, for example, for driving an ejection section 33 included in an ink jet printer 1 described below illustrated in FIG. 3. Note that the driving signal generation circuit 4 is an example of a "driving circuit". The driving signal generation circuit 4 will be briefly described with reference to FIG. 1. In FIG. 8, a circuit configuration of the driving signal generation circuit 4 will be described in detail.

As illustrated in FIG. 1, the driving signal generation circuit 4 includes a modulator 40, an amplifier 41, a smoothing section 42, and resistance elements RH and RL. The modulator 40 including a digital-to-analog converter (DAC) performs pulse modulation on a digital waveform specifying signal DCOM which specifies a waveform of the driving signal COM so as to generate a modulated signal. The modulator 40 converts the modulated signal into a high logic amplitude so as to generate a gate signal Ls and converts an inverted signal of the modulated signal into a high logic amplitude so as to generate a gate Lsb. Note that the inverted signal of the modulated signal is obtained by inverting a logic level of the modulated signal. Specifically, the modulator 40 generates the gate signals Ls and Lsb having logic levels of the exclusive relationship based on the waveform specifying signal DCOM. The modulator 40 supplies the gate signal Ls to the amplifier 41 through the resistance element RH and supplies the gate signal Lsb to the amplifier 41 through the resistance element RL. The waveform specifying signal DCOM is an example of a "signal" which specifies a waveform of a driving signal.

The amplifier 41 amplifies a modulated signal so as to generate an amplified signal Az. For example, the amplifier 41 includes transistors TrH, TrL, and TrS and a resistance element Rs. Each of the transistors TrH, TrL, and TrS is an N-channel field effect transistor (FET), for example. The transistor TrH is an example of a "first transistor", the transistor TrL is an example of a "second transistor", and the transistor TrS is an example of a "third transistor". Hereinafter, the transistors TrH, TrL, and TrS are collectively referred to as a transistor Tr where appropriate. Furthermore, the resistance elements RH, RL, and Rs are collectively referred to as a resistance element R where appropriate hereinafter.

The transistors TrH and TrL are coupled to each other in series between a voltage line to which a voltage Vh which is higher than a ground voltage is supplied and a grounding conductor to which the ground voltage is supplied. Specifically, the voltage Vh is supplied to a drain electrode of the transistor TrH, and the ground voltage is supplied to a source electrode of the transistor TrL. Furthermore, a source electrode of the transistor TrH and a drain electrode of the transistor TrL are coupled to a node Nd. The node Nd which couples the source electrode of the transistor TrH to the drain electrode of the transistor TrL is an example of a "coupling node" which couples the first and second transistors to each other.

The gate signal Ls is supplied to a gate electrode of the transistor TrH, and the gate signal Lsb is supplied to a gate electrode of the transistor TrL. The gate signal Lsb is an example of a "signal based on a modulated signal". The gate signal Ls in a high level has a voltage which turns the transistor TrH on. Furthermore, the gate signal Lsb in a high level has a voltage which turns the transistor TrL on.

For example, when the gate signal Ls is in a low level, the gate signal Lsb is in a high level, and therefore, the transistor TrH is turned off and the transistor TrL is turned on. Therefore, a voltage of the node Nd is set to a ground voltage. When the gate signal Ls is changed from the low level to a high level, the transistor TrH is turned on and the transistor TrL is turned off. Therefore, a voltage of the node Nd is changed from the ground voltage to a voltage Vh. In the driving signal generation circuit 4 included in the ink jet printer 1 illustrated in FIG. 3, the voltage Vh is approximately 42 volts which is larger than an amplitude of the modulated signal, for example. Specifically, an amplified signal Az generated by amplifying the modulated signal is obtained in the node Nd. In this way, the transistors TrH and TrL are exclusively turned on by the gate signals Ls and Lsb and the amplified signal Az is output from the node Nd.

The Transistor TrS suppresses occurrence of self turn-on of the transistor TrL. The self turn-on is unintentional turning-on of the transistor Tr in an Off state caused by rise of a voltage between the source and drain electrodes, for example. Occurrence of self turn-on of the transistor TrL will be described with reference to FIG. 2.

As illustrated in FIG. 1, a drain electrode of the transistor TrS is coupled to the gate electrode of the transistor TrL, and a source electrode of the transistor TrS is coupled to the grounding conductor. The gate electrode of the transistor TrS is coupled to the grounding conductor through the resistance element Rs, for example, so that a high impedance state is entered. The transistors TrL and TrS are formed on the same semiconductor substrate, for example. In this case, a parasitic inductance generated in a line between the transistors TrL and TrS and the like may be reduced and the occurrence of the self turn-on of the transistor TrL may be suppressed when compared with a configuration in which each of the transistors TrL and TrS is realized by a discrete circuit. Note that the transistors TrL and TrS may be formed on different semiconductor substrates. Furthermore, the transistors TrL and TrS may be included in the same package when being formed on different semiconductor substrates. Even in this configuration, a parasitic inductance generated in a line between the transistors TrL and TrS and the like may be reduced and the occurrence of the self turn-on of the transistor TrL may be suppressed when compared with an example in which each of the transistors TrL and TrS is realized by a discrete circuit.

The smoothing section 42 which is a low-pass filter, for example, performs smoothing on the amplified signal Az so as to generate the driving signal COM. In this way, the driving signal generation circuit 4 generates the driving signal COM based on the waveform specifying signal DCOM. Note that the driving signal generation circuit 4 is not limited to the example of FIG. 1. For example, the gate electrode of the transistor TrS may be coupled to the grounding conductor through a capacitance element, such as a capacitor. Next, the occurrence of the self turn-on of the transistor TrL will be described with reference to FIG. 2.

Figure 2:
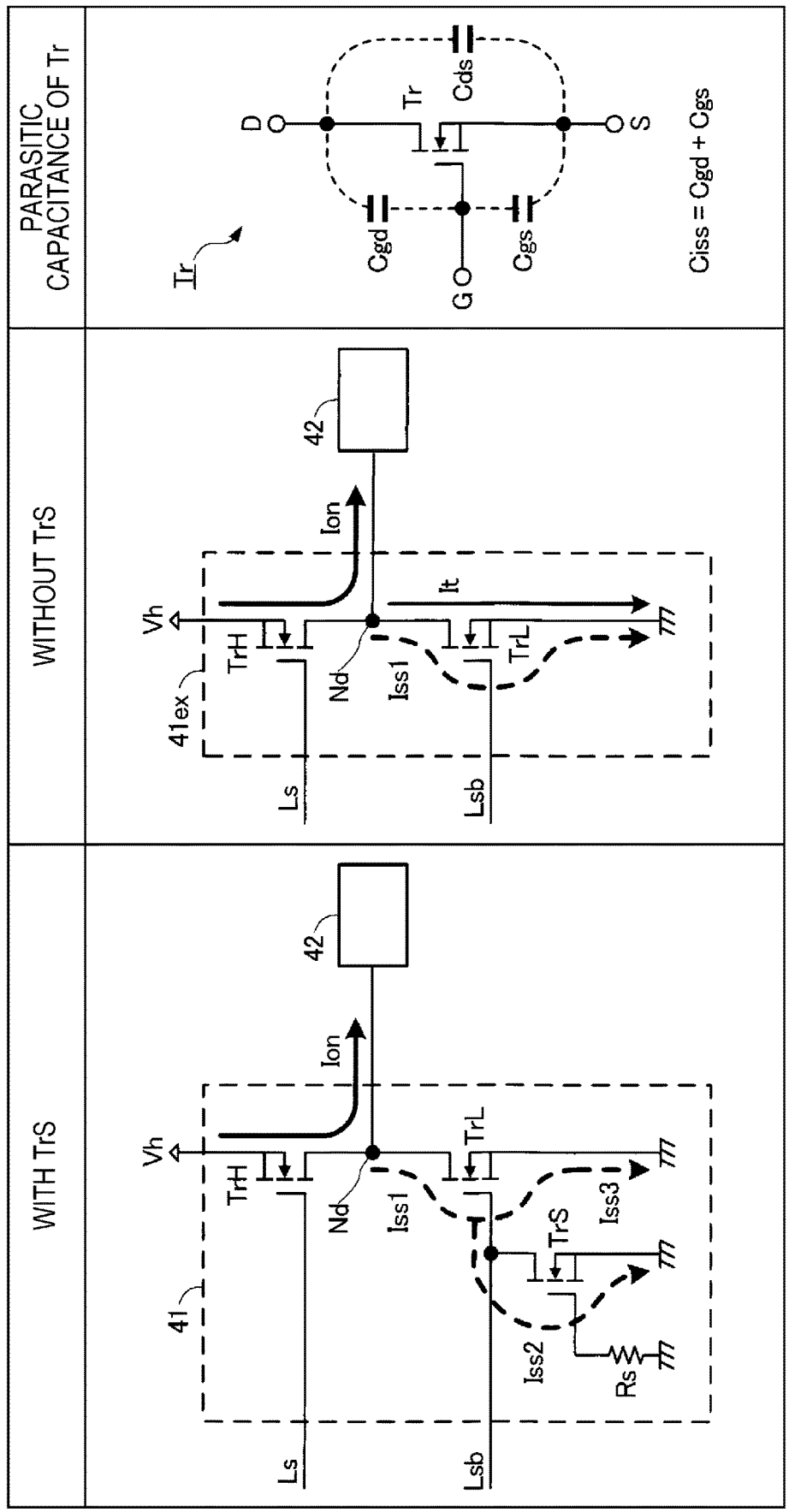
FIG. 2 is a diagram illustrating an example of current supplied to a transistor of an amplifier.

FIG. 2 is a diagram illustrating an example of current supplied to the transistor Tr of the amplifier 41. In a column "Parasitic Capacitance of Tr" in FIG. 2, "D" indicates the drain electrode of the transistor Tr, "G" indicates the gate electrode of the transistor Tr, and "S" indicates the source electrode of the transistor Tr. The transistor Tr includes parasitic capacitances Cgd, Cgs, and Cds and the like. The parasitic capacitance Cgd is a capacitance component between the drain and gate electrodes, the parasitic capacitance Cgs is a capacitance component between the gate and source electrodes, and the parasitic capacitance Cds is a capacitance component between the drain and source electrodes. Hereinafter, a sum of the parasitic capacitances Cgd and Cgs is also referred to as an input capacitance Ciss.

In FIG. 2, a column "Without TrS" indicates an example of a flow of current in an amplifier 41ex which does not include the transistor TrS. For example, when the gate signal Ls is changed from a low level to a high level, the transistor TrH is turned on and a current Ion is supplied from a voltage line to which the voltage Vh is supplied to the smoothing section 42 through the transistor TrH. Furthermore, since the transistor TrH is turned on, a voltage of the drain electrode of the transistor TrL is changed from the ground voltage to the voltage Vh. When the voltage of the drain electrode of the transistor TrL is dramatically changed, a current Iss1 is supplied to the parasitic capacitance Cgd of the transistor TrL and the voltage of the gate electrode of the transistor TrL may become equal to or larger than a threshold voltage of the transistor TrL. In this case, self turn-on occurs in the transistor TrL and a through-current It is supplied to the transistor TrL. Therefore, in the amplifier 41ex which does not include the transistor TrS, power consumption is increased. On the other hand, in this embodiment, the occurrence of self turn-on of the transistor TrL may be suppressed by means of the transistor TrS as described above.

As illustrated in a column "With TrS" in FIG. 2, a current Iss1 which is supplied to the parasitic capacitance Cgd of the transistor TrL is branched to a current Iss2 supplied to the parasitic capacitance Cgd of the transistor TrS and a current Iss3 supplied to the parasitic capacitance Cgs of the transistor TrL. By this, a voltage change at the gate electrode of the transistor TrL may be reduced and the occurrence of the self turn-on of the transistor TrL may be suppressed. Furthermore, a voltage of the gate electrode of the transistor TrL rises when the self turn-on occurs in the transistor TrL, and therefore, a voltage of the drain electrode of the transistor TrS also rises. Since the voltage of the drain electrode of the transistor TrS rises, self turn-on occurs in the transistor TrS. When the transistor TrS is turned on, the voltage of the gate electrode of the transistor TrL coupled to the drain electrode of the transistor TrS is changed to the ground voltage, and therefore, the transistor TrL is maintained to an Off state. Consequently, supply of a through-current to the transistor TrL may be suppressed and increase in power consumption in the amplifier 41 may be suppressed.

As described above, the amplifier 41 includes the transistor TrS coupled to the gate electrode of the transistor TrL, and therefore, occurrence of self turn-on of the transistor TrL may be suppressed when compared with a configuration in which the transistor TrS is not included.

Here, a transistor Tr designed to have a response speed equal to or larger than that of the transistor TrL may be used as the transistor TrS, for example. Specifically, a threshold voltage of the transistor TrS may be equal to or lower than the threshold voltage of the transistor TrL. Furthermore, a capacitance value of an input capacitance Ciss of the transistor TrS may be equal to or smaller than a capacitance value of an input capacitance Ciss of the transistor TrL. Alternatively, a gate charge amount of the transistor TrS may be equal to or smaller than a gate charge amount of the transistor TrL. The gate charge amount is to be supplied to the gate electrode when the transistor Tr is switched from an On state to an Off state. Next, a configuration of the ink jet printer 1 according to this embodiment will be described with reference to FIGS. 3 and 4.

Figure 3:
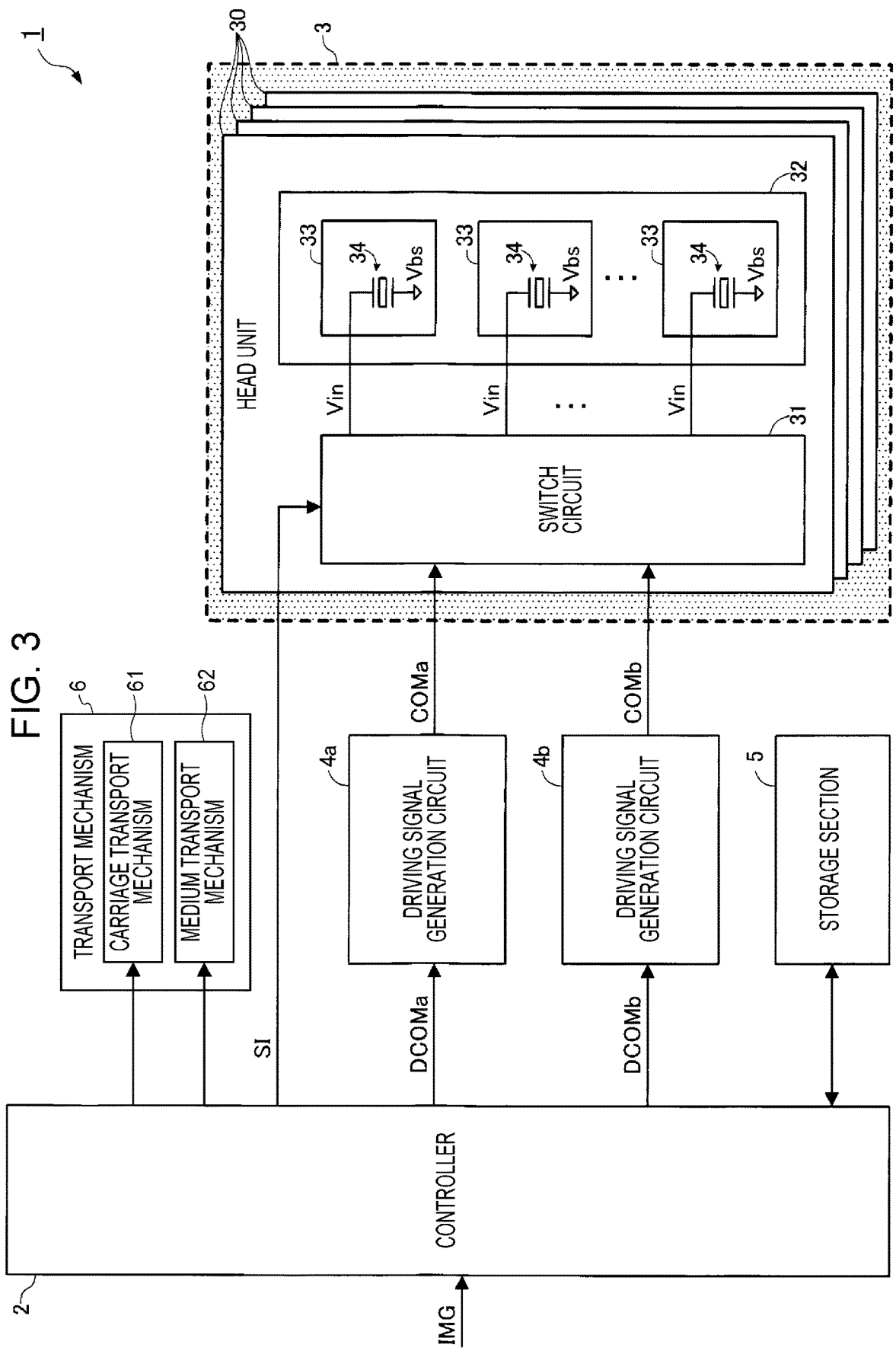
FIG. 3 is a block diagram illustrating an example of a configuration of an ink jet printer according to the present disclosure.

FIG. 3 is a functional block diagram illustrating an example of a configuration of the ink jet printer 1. In FIG. 3, suffixes "a" and "b" are assigned to the reference numerals of the driving signal generation circuits 4 so that the two driving signal generation circuits 4 are distinguished from each other. Specifically, "a" is added to tail ends of the reference numerals of the waveform specifying signal DCOM supplied to a driving signal generation circuit 4a and the driving signal COM generated by the driving signal generation circuit 4a. Similarly, "b" is added to tail ends of the reference numerals of the waveform specifying signal DCOM supplied to a driving signal generation circuit 4b and the driving signal COM generated by the driving signal generation circuit 4b. Note that the elements and the like above may be described in FIG. 3 onwards without assigning "a" or "b" in the trailing ends of the reference numerals when the elements described above are not particularly distinguished from each other.

Print data IMG indicating an image to be formed by the ink jet printer 1 is supplied from a host computer, such as a personal computer or a digital still camera, to the ink jet printer 1. The ink jet printer 1 executes a process of printing an image indicated by the print data IMG supplied from the host computer on the recording sheet P.

As illustrated in FIG. 3, the ink jet printer 1 includes a controller 2, a head module 3, the driving signal generation circuits 4a and 4b, a storage section 5 which stores various information, and a transport mechanism 6.

The controller 2 is a computer, such as a central processing unit (CPU), which controls the various sections included in the ink jet printer 1, for example. The controller 2 may include at least one processor. The controller 2 controls operations of the various sections included in the ink jet printer 1 by reading and executing programs stored in the storage section 5 or the like. Note that a number of or all the components which are realized when the controller 2 reads and executes the programs may be realized by hardware using an electronic circuit, such as a field programmable gate array (FPGA) or an application specific Integrated Circuit (ASIC). Alternatively, all or a number of the functions of the controller 2 may be realized by a combination of software and hardware.

The controller 2 generates signals for controlling the operations of the various sections of the ink jet printer 1, such as a print signal SI and waveform specifying signals DCOMa and DCOMb. Here, the waveform specifying signal DCOMa is a digital signal which specifies a waveform of a driving signal COMa, and the waveform specifying signal DCOMb a digital signal which specifies a waveform of a driving signal COMb. Note that the driving signal COM is an analog signal for driving the ejection section 33 described below.

Furthermore, the print signal SI is a digital signal which specifies a type of an operation of the ejection section 33. Specifically, the print signal SI specifies a type of an operation of the ejection section 33 by determining whether the driving signal COM is to be supplied to the ejection section 33.

The driving signal generation circuit 4a receives the waveform specifying signal DCOMa from the controller 2. Then the driving signal generation circuit 4a outputs the driving signal COMa having a waveform specified by the waveform specifying signal DCOMa to a switch circuit 31 described below. The driving signal generation circuit 4b receives the waveform specifying signal DCOMb from the controller 2. Then the driving signal generation circuit 4b outputs the driving signal COMb having a waveform specified by the waveform specifying signal DCOMb to the switch circuit 31 described below. The driving signal generation circuit 4 will be described in detail with reference to FIG. 8.

The head module 3 includes four head units 30. Note that the number of head units 30 included in the head module 3 is not limited to four. For example, the number of head units 30 included in the head module 3 may be one, two, or three. Alternatively, the number of head units 30 included in the head module 3 may be five or more. Although only one of the four head units 30 will be described hereinafter, the description is true to the others of the head units 30.

The head unit 30 includes the switch circuit 31 and a recording head 32. The recording head 32 includes a plurality of ejection sections 33. The switch circuit 31 generates individual driving signals Vin for individually driving the plurality of ejection sections 33 included in the recording head 32 based on various signals including the driving signals COMa and COMb and the print signal SI. The switch circuit 31 will be described in detail with reference to FIG. 5.

Each of the ejection sections 33 included in the recording head 32 includes a piezoelectric element 34. A corresponding one of the individual driving signals Vin is supplied to one end of the piezoelectric element 34, and a voltage Vbs is supplied to the other end of the piezoelectric element 34. The piezoelectric element 34 is displaced in accordance with a difference between the individual driving signal Vin supplied from the switch circuit 31 and the voltage Vbs. The individual ejection sections 33 eject ink in accordance with displacement of the corresponding piezoelectric elements 34.

The transport mechanism 6 includes a carriage transport mechanism 61 and a medium transport mechanism 62 and changes a position of the recording sheet P relative to the head module 3. Operation of the transport mechanism 6 and the like will be described with reference to FIG. 4.

Figure 4:
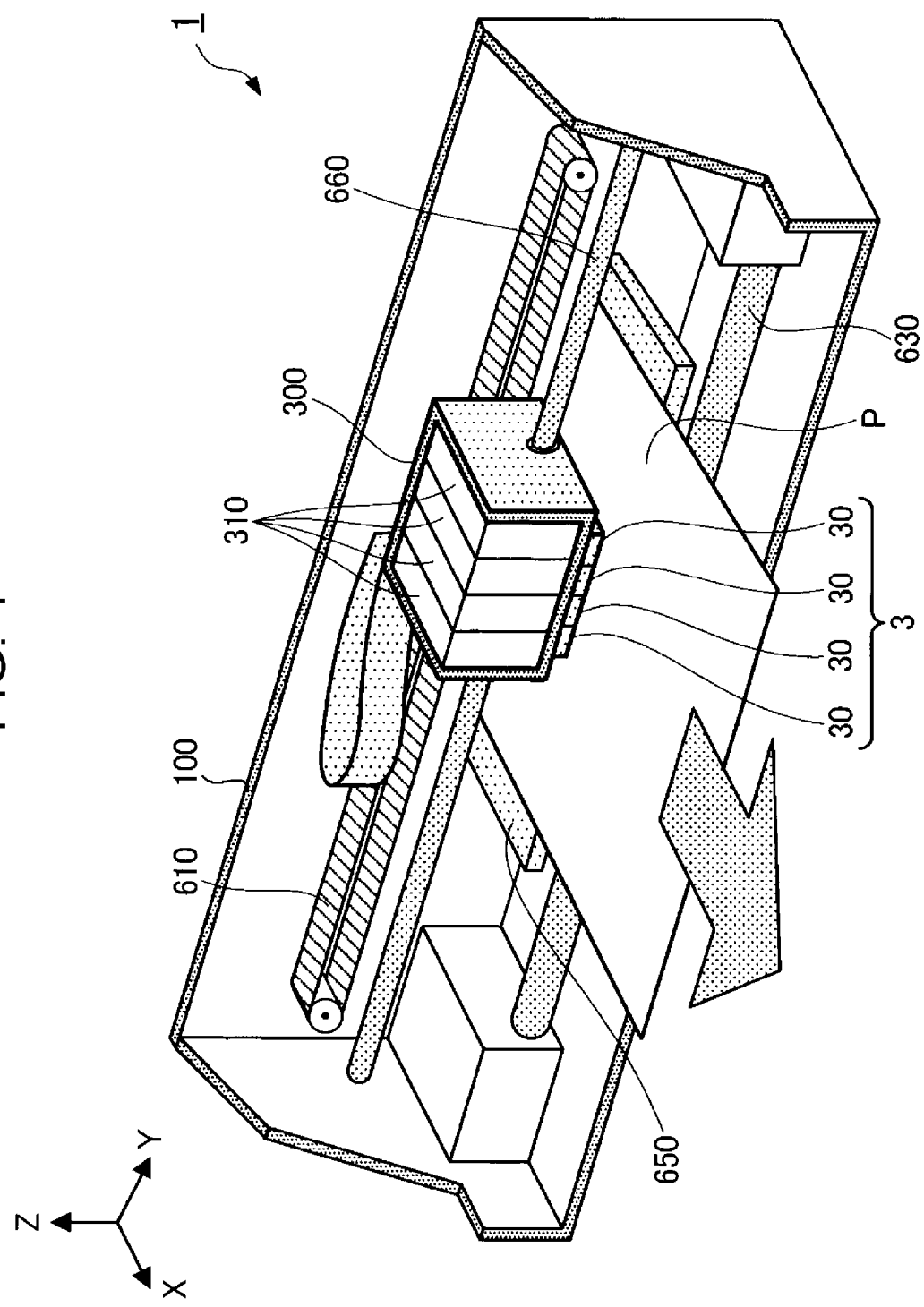
FIG. 4 is a perspective view schematically illustrating an example of an internal configuration of the ink jet printer.

FIG. 4 is a perspective view schematically illustrating an example of an internal configuration of the ink jet printer 1. As illustrated in FIG. 4, it is assumed that the ink jet printer 1 is a serial printer in this embodiment. Specifically, when a print process is executed, the ink jet printer 1 ejects ink from the ejection sections 33 while the printing sheet P is transported in a sub scanning direction and the head module 3 reciprocates in a main scanning direction which intersects with the sub scanning direction so as to form dots corresponding to the print data IMG on the recording sheet P.

Hereinafter, a description will be made using X, Y, and Z axes which are orthogonal to one another as illustrated in FIG. 4 where appropriate for simplicity of description. Furthermore, a direction indicated by an arrow mark of the X axis is referred to as a +X direction and a reversed direction of the +X direction is referred to as a −X direction. Similarly, a direction indicated by an arrow mark of the Y axis is referred to as a +Y direction and a reversed direction of the +Y direction is referred to as a −Y direction. A direction indicated by an arrow mark of the Z axis is referred to as a +Z direction and a reversed direction of the +Z direction is referred to as a −Z direction. Furthermore, the +X direction corresponds to the sub scanning direction and the +Y and −Y directions are referred to as the main scanning direction in this embodiment.

As illustrated in FIG. 4, the ink jet printer 1 includes a case 100 and a carriage 300 which includes the head module 3 and which may reciprocate in the +Y and −Y directions in the case 100. Furthermore, the ink jet printer 1 includes the transport mechanism 6 as described above.

The transport mechanism 6 causes the carriage 300 to reciprocate in the +Y and −Y directions and transports the recording sheet P in the +X direction so as to change a position of the recording sheet P relative to the head module 3. By this, the transport mechanism 6 enables ink impact on the entire recording sheet P. The transport mechanism 6 includes the carriage transport mechanism 61 which causes the carriage 300 to reciprocate and the medium transport mechanism 62 which transports the recording sheet P as illustrated in FIG. 3. The transport mechanism 6 further includes a carriage guide shaft 660 which supports the carriage 300 so that the carriage 300 freely reciprocates in the +Y and −Y directions and a timing belt 610 which is fixed on the carriage 300 and driven by the carriage transport mechanism 61 as illustrated in FIG. 4. By this, the transport mechanism 6 may cause the head module 3 to reciprocate with the carriage 300 in the +Y direction and the −Y direction along the carriage guide shaft 660. The transport mechanism 6 further includes a platen 650 disposed in a −Z direction relative to the carriage 300 and a transport roller 630 which rotates in accordance with driving of the medium transport mechanism 62 and which transports the recording sheet P on the platen 650 in the +X direction.

In this embodiment, it is assumed that the carriage 300 stores four ink cartridges 310 corresponding to four ink colors, that is, cyan, magenta, yellow, and black, one by one as illustrated in FIG. 4. Furthermore, in this embodiment, it is assumed that the four ink cartridges 310 are disposed so as to correspond to the four head units 30 one by one, as an example. The ejection sections 33 receive supply of the inks from the ink cartridges 310 corresponding to the head units 30 having the respective ejection sections 33. The ejection sections 33 may be filled with the inks supplied from the ink cartridges 310 therein and eject the inks included in the ejection sections 33 from nozzles. Note that the ink cartridges 310 may be disposed on an outside of the carriage 300.

Here, operation of the controller 2 performed when the print process is executed will be briefly described. When the print process is executed, the controller 2 first stores the print data IMG supplied from the host computer in the storage section 5. Thereafter, the controller 2 generates a signal for controlling the head units 30, such as the print signal SI, a signal for controlling the driving signal generation circuit 4, such as the waveform specifying signal DCOM, and a signal for controlling the transport mechanism 6 based on the various data including the print data IMG stored in the storage section 5. Then the controller 2 controls the driving signal generation circuit 4 and the switch circuit 31 so that the ejection sections 33 are driven while controlling the transport mechanism 6 so that a position of the recording sheet P relative to the head module 3 is changed based on the various signals including the print signal SI and the various data stored in the storage section 5. Accordingly, the controller 2 controls ejection/non-ejection of ink from the ejection sections 33, an amount of ink to be ejected, a timing when the ink is ejected, and the like and controls the various sections included in the ink jet printer 1 so that the print process of forming an image corresponding to the print data IMG on the recording sheet P is executed.

Note that a configuration of the ink jet printer 1 is not limited to the example illustrated in FIGS. 3 and 4. For example, the ink jet printer 1 may be a line printer including a plurality of nozzles are arranged in a region larger than a width of the recording sheet P in the recording head 32. Next, a configuration and an operation of the switch circuit 31 will be described with reference to FIGS. 5 to 7.

Figure 5:
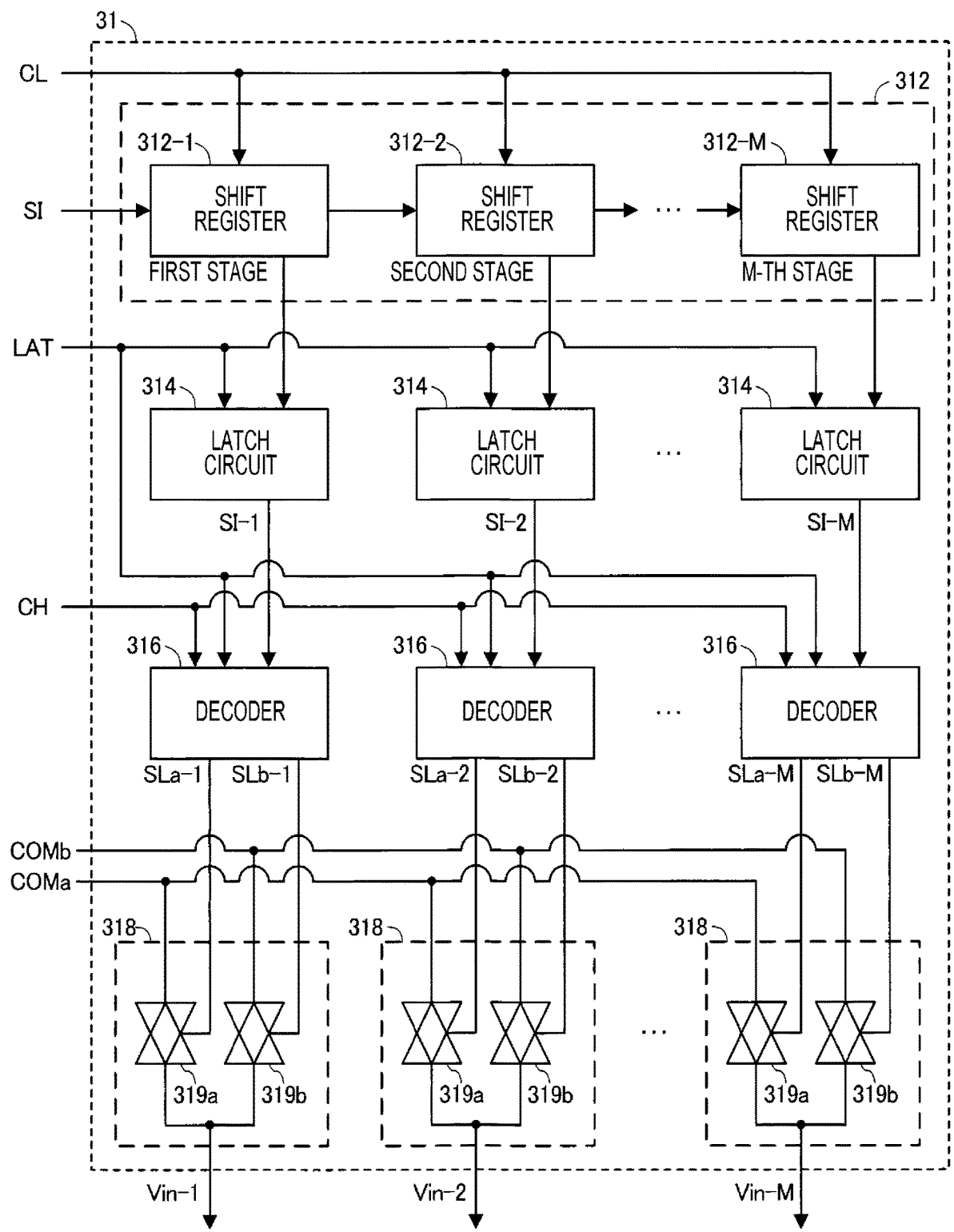
FIG. 5 is a block diagram illustrating a configuration of a switch circuit.

FIG. 5 is a block diagram illustrating a configuration of the switch circuit 31. The switch circuit 31 includes a shift register 312, a plurality of latch circuits 314, a plurality of decoders 316, and a plurality of switch sections 318, for example. The number of stages of the shift register 312 is the same as the number of ejection sections 33. It is assumed, in the example of FIG. 5, that the number of ejection sections 33 is M. Note that M is a natural number equal to or larger than 1. Furthermore, in FIG. 5, a circuit corresponding to an m-th stage of the shift register 312 is referred to as a shift register 312-*m*. Here, m is a natural number which is equal to or larger than 1 and which is equal to or smaller than M.

A group of the shift register 312-*m*, a corresponding one of the latch circuits 314, a corresponding one of the decoders 316, and a corresponding one of the switch sections 318 is disposed for a corresponding one of the ejection sections 33 one by one. Hereinafter, one of the latch circuits 314 corresponding to the shift register 312-*m* is also referred to as a latch circuit 314-*m*, and one of the decoders 316 corresponding to the shift register 312-*m* is also referred to as a decoder 316-*m*. Similarly, one of the switch sections 318 corresponding to the shift register 312-*m* is also referred to as a switch section 318-*m*, and one of the ejection sections 33 corresponding to the shift register 312-*m* is also referred to as an ejection section 33-*m*. Furthermore, the print signal SI output from the latch circuit 314-*m* is also referred to as a print signal SI-m. A selection signal SLa output from the decoder 316-*m* is also referred to as a selection signal SLa-m, and a selection signal SLb output from the decoder 316-*m* is also referred to as a selection signal SLb-m. The individual driving signal Vin output from the switch section 318-*m* is also referred to as an individual driving signal Vin-m.

The controller 2 supplies a clock signal CL, the print signal SI, a latch signal LAT, a change signal CH, and the driving signals COMa and COMb to the switch circuit 31. The driving signals COMa and COMb have a waveform for driving the ejection sections 33 as described above.

Furthermore, the print signal SI is a digital signal which specifies amounts of inks to be ejected from the ejection sections 33-1 to 33-M as described above and includes print signals SI-1 to SI-M. Among the print signals SI-1 to SI-M, the print signal SI-m specifies ejection/non-ejection of ink from the ejection section 33-*m* and an amount of ink to be ejected by the ejection section 33-*m* by two bits including a high-order bit b1 and a low-order bit b2. Specifically, the print signal SI-m specifies one of ejection of an amount of ink corresponding to a large dot, ejection of an amount of ink corresponding to a medium dot, ejection of an amount of ink corresponding to a small dot, and non-ejection of ink for the ejection section 33-*m*.

The switch circuit 31 supplies the individual driving signal Vin-m having a waveform specified by the print signal SI-m to the ejection section 33-*m*.

Among the shift registers 312-1 to 312-M, the shift registers 312-*m* except for the shift register 312-M in the last stage transfer the print signal SI to the next stages in turn in accordance with the clock signal CL. For example, the print signal SI of two bits is serially supplied from the controller 2 to the shift register 312-1 in the first stage in synchronization with the clock signal CL. The shift register 312-1 temporarily holds the print signal SI of two bits and transfers the print signal SI in turn to the next stage in accordance with the clock signal CL. Similarly, among the shift registers 312-2 to 312-M, the shift registers 312-*m* except for the shift register 312-M in the last stage temporarily hold the print signal SI of two bits transferred from the preceding stages and transfer the print signal SI to the next stages in turn in accordance with the clock signal CL. When the print signal SI is transferred to the shift register 312-M in the last stage, among the print signals SI, the print signals SI of two bits corresponding to the individual ejection sections 33 are temporarily held in the respective shift registers 312-1 to 312-M. Specifically, when the print signal SI is transferred to the shift register 312-M, the shift register 312-*m* holds the print signal SI-m of two bits corresponding to the ejection section 33-*m*.

The M latch circuits 314 simultaneously latch the print signals SI of two bits corresponding to the individual stages which are held in the respective shift registers 312-1 to 312-M at a timing when the latch signal LAT rises.

Here, an operation period in which the ink jet printer 1 performs the print process includes a plurality of unit periods Tu. The controller 2 supplies the print signal SI to the switch circuit 31 every unit period Tu and supplies the latch signal LAT which causes the latch circuits 314 to latch the print signal SI to the switch circuit 31 every unit period Tu. Furthermore, the controller 2 supplies the waveform specifying signal DCOMa and the clock signal CL to the driving signal generation circuit 4*a* so as to control the operation of the driving signal generation circuit 4*a* such that the driving signal generation circuit 4*a* supplies the driving signal COMa to the switch circuit 31 every unit period Tu. Furthermore, the controller 2 executes control on the driving signal generation circuit 4*b* similarly to the control performed on the driving signal generation circuit 4*a*. By this, the controller 2 controls the operation of the switch circuit 31 such that the ejection sections 33 perform one of ejection of an amount of ink corresponding to a large dot, ejection of an amount of ink corresponding to a medium dot, ejection of an amount of ink corresponding to a small dot, and non-ejection of ink in each unit period Tu.

Note that, in this embodiment, the controller 2 divides the unit period Tu into control periods Ts1 and Ts2 in accordance with the change signal CH. It is assume, in this embodiment, that the control periods Ts1 and Ts2 have the same time length. Hereinafter, the control periods Ts1 and Ts2 are collectively referred to as a control period Ts where appropriate.

The decoder 316-*m* decodes the print signal SI-m latched by the latch circuit 314-*m* and outputs the selection signals SLa-m and SLb-m. The selection signal SLa-m is the selection signal SLa used to select the driving signal COMa, and the selection signal SLb-m is the selection signal SLb used to select the driving signal COMb. An example of content of decoding performed by the decoders 316 will be described in detail with reference to FIG. 6.

Each of the switch sections 318 includes transmission gates 319*a* and 319*b*. For example, the transmission gate 319*a* included in the switch section 318-*m* is turned on when the selection signal SLa-m is in a high level and turned off when the selection signal SLa-m is in a low level. Furthermore, the transmission gate 319*b* included in the switch section 318-*m* is turned on when the selection signal SLb-m is in a high level and turned off when the selection signal SLb-m is in a low level.

For example, in the example of FIG. 6 described below, when the print signal SI indicates (1, 0), the selection signal SLa is set to a high level and the selection signal SLb is set to a low level in the control period Ts1, and the selection signal SLa is set to a low level and the selection signal SLb is set in a high level in the control period Ts2. In this case, the transmission gate 319*a* is turned on and the transmission gate 319*b* is turned off in the control period Ts1, and the transmission gate 319*a* is turned off and the transmission gate 319*b* is turned on in the control period Ts2.

As illustrated in FIG. 5, the driving signal COMa is supplied to one end of the transmission gate 319*a* included in the switch section 318-*m*, and the driving signal COMb is supplied to one end of the transmission gate 319*b*. Furthermore, the other ends of the transmission gates 319*a* and 319*b* included in the switch section 318-*m* are electrically coupled to the piezoelectric element 34 included in the ejection section 33-*m*. According to this embodiment, in each of the switch sections 318, one of the transmission gates 319*a* and 319*b* is turned on and the other is turned off in each control period Ts. Specifically, in each control period Ts, the switch section 318-*m* supplies one of the driving signals COMa and COMb as the individual driving signal Vin-m to the ejection section 33-*m*. Next, content of decoding performed by the decoders 316 will be described with reference to FIG. 6.

FIG. 6 is a diagram illustrating content of decoding performed by one of the decoders 316. The decoder 316 outputs the selection signals SLa and SLb in both the control periods Ts1 and Ts2 in each unit period Tu. For example, when the print signal SI supplied in the unit period Tu is represented as "(b1, b2)=(0, 1)", the decoder 316 sets the selection signal SLa in a low level and the selection signal SLb in a high level in the control period Ts1. Furthermore, when the print signal SI is represented by "(b1, b2)=(0, 1)", the decoders 316 sets the selection signal SLa in a high level and the selection signal SLb in a low level in the control period Ts2. Next, an operation of the switch circuit 31 and the like in each unit period Tu will be described with reference to FIG. 7.

Figure 7:
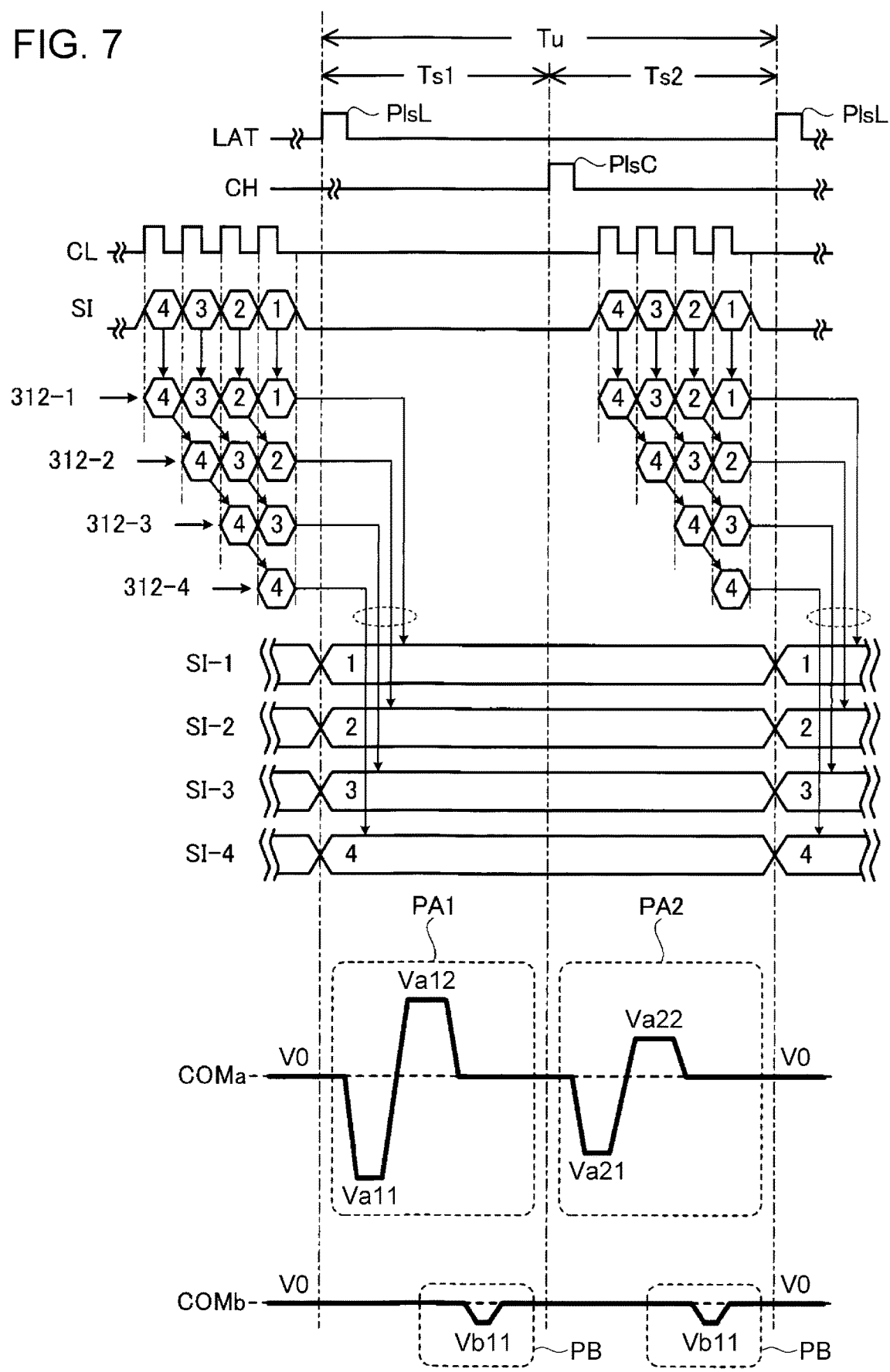
FIG. 7 is a timing chart of an operation performed by a switch circuit.

FIG. 7 is a timing chart of an operation performed by the switch circuit 31. Note that FIG. 7 is a timing chart for describing various signals supplied from the controller 2 to the switch circuit 31 in each unit period Tu and an operation of the switch circuit 31 in each unit period Tu. It is assumed in FIG. 7 that M is 4 for convenience of the drawing.

The unit period Tu is defined by a pulse PlsL included in the latch signal LAT. Furthermore, the control periods Ts1 and Ts2 are defined by the pulse PlsL and a pulse PlsC included in the change signal CH. The controller 2 supplies the print signal SI to the switch circuit 31 in a state in which the print signal SI is synchronized with the clock signal CL before start of each unit period Tu. Thereafter, the shift register 312-$m$ included in the switch circuit 31 transfers the print signal SI supplied from the controller 2 in turn in accordance with the clock signal CL.

The driving signal COMa output from the driving signal generation circuit 4$a$ in each unit period Tu has ejection waveforms PA1 and PA2. The ejection waveform PA1 is included in the driving signal COMa in the control period Ts1. For example, the ejection waveform PA1 causes the ejection section 33 to eject ink of a medium amount corresponding to a medium dot, when the individual driving signal Vin having the ejection waveform PA1 is supplied to the ejection section 33. The ejection waveform PA2 is included in the driving signal COMa in the control period Ts2. For example, the ejection waveform PA2 causes the ejection section 33 to eject ink of a small amount corresponding to a small dot, when the individual driving signal Vin having the ejection waveform PA2 is supplied to the ejection section 33. Specifically, a potential difference between a lowest potential Va11 and a highest potential Va12 of the ejection waveform PA1 is larger than a potential difference between a lowest potential Va21 and a highest potential Va22 of the ejection waveform PA2.

Furthermore, the driving signal COMb output from the driving signal generation circuit 4$b$ in each unit period Tu has a micro vibration waveform PB. The micro vibration waveform PB does not cause the ejection section 33 to eject ink when the individual driving signal Vin having the micro vibration waveform PB is supplied to the ejection section 33. Specifically, the micro vibration waveform PB suppresses viscosity of ink by applying micro vibration on the ink included in the ejection sections 33. For example, a potential difference between a lowest potential Vb11 and a highest potential V0 of the micro vibration waveform PB is determined to be smaller than a potential difference between the lowest potential Va21 and the highest potential Va22 of the ejection waveform PA2. In the example of FIG. 7, the highest potential V0 of the micro vibration waveform PB is a reference potential. Next, a configuration of the driving signal generation circuit 4 will be described with reference to FIG. 8.

FIG. 8 is a diagram illustrating a configuration of the driving signal generation circuit 4. Note that, in FIG. 8, a configuration of the driving signal generation circuit 4$a$ among the driving signal generation circuits 4$a$ and 4$b$ is illustrated. The configuration and operation of the driving signal generation circuit 4$b$ are the same as those of the driving signal generation circuit 4$a$, and therefore, descriptions thereof are omitted. First, operation of the driving signal generation circuit 4$a$ will be briefly described before the configuration of the driving signal generation circuit 4$a$ is illustrated.

The driving signal generation circuit 4$a$ generates the driving signal COMa based on the waveform specifying signal DCOMa. For example, first, the driving signal generation circuit 4$a$ converts the digital waveform specifying signal DCOMa supplied from the controller 2 into an analog signal. Second, the driving signal generation circuit 4$a$ feeds back the driving signal COMa of an output, corrects a deviation between an attenuated signal based on the driving signal COMa and a target signal using a high-frequency component of the driving signal COMa and generates a modulated signal in accordance with the corrected signal. Third, the driving signal generation circuit 4$a$ generates an amplified signal by switching a transistor in accordance with the modulated signal. Fourth, the driving signal generation circuit 4$a$ performs smoothing on the amplified signal using a low-pass filter and outputs the smoothed signal as the driving signal COMa. Next, a configuration of the driving signal generation circuit 4$a$ will be described.

In FIG. 8, it is assumed that the modulator 40 is realized by large scale integration (LSI). In this case, the driving signal generation circuit 4$a$ includes various elements including the LSI, the transistors Tr, the resistance elements R and the capacitors.

The waveform specifying signal DCOMa is supplied from the controller 2 to the modulator 40 through an input terminal TnIN. The modulator 40 outputs the gate signal Ls to the gate electrode of the transistor TrH and outputs the gate signal Lsb to the gate electrode of the transistor TrL, for example, based on the waveform specifying signal DCOMa.

For example, the modulator 40 includes a DAC 402, a subtracter 404, an adder 406, an attenuator 408, an integration attenuator 412, a comparator 420, and a gate driver 430. The DAC 402 converts the waveform specifying signal DCOMa which specifies a waveform of the driving signal COMa into an analog signal Aa to be supplied to an input terminal "−" of the subtracter 404. Note that a voltage amplitude of the signal Aa is approximately 0 to 2 volts, and a signal obtained by amplifying the voltage approximately 20 times corresponds to the driving signal COMa. Specifically, the signal Aa is a target before the amplification of the driving signal COMa.

The integration attenuator 412 supplies a signal Ax generated by attenuating and integrating the driving signal COMa which is fed back through a terminal Tn1 to an input terminal "+" of the subtracter 404. The subtracter 404 supplies a signal Ab indicating a voltage generated by subtracting a voltage of the input terminal "−" from a voltage of the input terminal "+" to the adder 406. Note that a power source voltage of a circuit from the DAC 402 to the comparator 420 is 3.3 volts of a low amplitude, for example. In this case, a voltage of the signal Aa is approximately 2 volts at maximum. On the other hand, a voltage of the driving signal COMa exceeds 40 volts in some cases. Therefore, the integration attenuator 412 attenuates the voltage of the driving signal COMa so that an amplitude range of the signal Ax matches an amplitude range of a signal in the circuit from the DAC 402 to the comparator 420.

The attenuator 408 supplies a signal Ay generated by attenuating a high-frequency component of the driving signal COMa which is fed back through a terminal Tn2 to the adder 406. Note that the attenuation performed by the attenuator 408 is performed, as with the integration attenuator 412, so that an amplitude range of the signal Ay matches the amplitude range of the signal in the circuit from the DAC 402 to the comparator 420.

The adder 406 supplies a signal As indicating a voltage generated by adding a voltage indicated by the signal Ab and a voltage indicated by the signal Ay to each other to the comparator 420. A voltage of the signal As is generated by subtracting the voltage of the signal Aa from an attenuated voltage of the signal supplied to the terminal Tn1 and adding a resultant voltage to an attenuated voltage of the signal supplied to the terminal Tn2. Accordingly, a voltage of the signal As is generated by correcting a deviation obtained by subtracting the target voltage of the signal Aa from the attenuated voltage of the driving signal COMa output from an output terminal TnOUT using a high-frequency component of the driving signal COMa.

The comparator 420 outputs a modulated signal Ms obtained by performing pulse modulation on the signal As. Specifically, the comparator 420 outputs the modulated signal Ms which becomes a high level when the signal As is equal to or higher than a threshold voltage Vth1 in voltage rise of the signal As and which becomes a low level when the signal As is equal to or lower than a threshold voltage Vth2 in voltage drop of the signal As. Note that the threshold voltage Vth1 is larger than the threshold voltage Vth2.

The modulated signal Ms is supplied to the gate driver 430. The gate driver 430 supplies the gate signal Ls generated by converting the modulated signal Ms into a high-logic amplitude to the gate electrode of the transistor TrH through a terminal TnH and the resistance element RH. Furthermore, the gate driver 430 supplies the gate signal Lsb generated by converting an inverted signal of the modulated signal Ms into a high-logic amplitude to the gate electrode of the transistor TrL through a terminal TnL and the resistance element RL. Therefore, as described with reference to FIG. 1, logic levels of the gate signals Ls and Lsb supplied to the gate electrodes of the transistors TrH and TrL, respectively, have the exclusive relationship. Note that the gate driver 430 may control timings when the gate signals Ls and Lsb are output so that the logic levels of the gate signals Ls and Lsb to be output to the amplifier 41 are not simultaneously brought into a high level. Specifically, the exclusive relationship here means that the logic levels of the gate signals Ls and Lsb supplied to the gate electrodes of the transistors TrH and TrL, respectively, are not simultaneously brought into a high level. Furthermore, when the transistors TrH and TrL do not perform self turn-on, the exclusive relationship between the logic levels of the gate signals Ls and Lsb means that the transistors TrH and TrL are not simultaneously turned on.

In FIG. 8, for simplicity of description of a resistance value of the resistance element Rs included in the amplifier 41, among the elements included in the gate driver 430, a transistor TrGD which outputs the gate signal Lsb to the gate electrode of the transistor TrL is illustrated. The transistor TrGD is an example of a "fourth transistor". The transistor TrGD is an N-channel FET, for example, and a source electrode thereof is coupled to the grounding conductor and a drain electrode thereof is coupled to the terminal TnL. A signal having a logic value which is the same as that of the modulated signal Ms is supplied to a gate electrode of the transistor TrGD.

The amplifier 41 has been described with reference to FIG. 1, and therefore, a detailed description thereof is omitted. As illustrated in FIG. 8, a voltage Vh of 42 volts, for example, is applied to the drain electrode of the transistor TrH on a high-order side which is a high-side transistor between the transistors TrH and TrL as described with reference to FIG. 1. Furthermore, the source electrode of the transistor TrL on a low-order side which is a low-side transistor between the transistors TrH and TrL is coupled to the grounding conductor to which the ground voltage is supplied. The transistors TrH and TrL are exclusively set in an On state in accordance with the modulated signal Ms, and the node Nd which couples the transistors TrH and TrL to each other outputs the amplified signal Az.

Furthermore, the transistor TrS disposed between the gate electrode of the transistor TrL and the grounding conductor suppresses occurrence of the self turn-on of the transistor TrL. The gate electrode of the transistor TrS is coupled to the grounding conductor through the resistance element Rs. A resistance value of the resistance element Rs may be equal to or larger than a value of an ON resistance of the transistor TrGD, for example.

Here, when capability of the gate driver 430 is insufficient, or when driving capability of the transistor TrGD is low, the probability of occurrence of the self turn-on is high in the transistor TrL when compared with the gate driver 430 having sufficient capability. In this embodiment, since the transistor TrS is disposed between the gate electrode of the transistor TrL and the grounding conductor as described above, even when the capability of the gate driver 430 is insufficient, occurrence of the self turn-on of the transistor TrL may be suppressed. Specifically, power consumption of the driving signal generation circuit 4a may be reduced. In this way, according to this embodiment, loss of the driving signal generation circuit 4a may be reduced and high-speed switching may be realized.

The smoothing section 42 includes an inductor L0 and a capacitor C0. The inductor L0 has one terminal electrically coupled to the node Nd and the other terminal electrically coupled to the output terminal TnOUT. The capacitor C0 has one end electrically coupled to the output terminal TnOUT and the other terminal coupled to the grounding conductor.

In the example illustrated in FIG. 8, the driving signal generation circuit 4a includes a pull-up circuit 43 which pulls up the driving signal COMa output to the output terminal TnOUT and which feeds the driving signal COMa back to the terminal Tn1. The pull-up circuit 43 includes a resistance element R1 having one end electrically coupled to the output terminal TnOUT and the other end electrically coupled to the terminal Tn1, and an resistance element R2 having one end electrically coupled to the terminal Tn1 and the other end to which the voltage Vh is applied.

Furthermore, in the example of FIG. 8, the driving signal generation circuit 4a includes a band pass filter (BPF) 44 which cuts a direct-current component of a high-frequency component of the driving signal COMa and which feeds back a resultant signal to the terminal Tn2. The BPF 44 includes resistance elements R3 and R4 and capacitors C1 to C3. The resistance element R4 has one end electrically coupled to one end of the resistance element R3 and the other end coupled to the grounding conductor. The capacitor C1 has one end electrically coupled to the output terminal TnOUT and the other end electrically coupled to the one end of the resistance element R3. The capacitor C2 has one end electrically coupled to the other end of the resistance element R3 and the other end coupled to the grounding conductor. The capacitor C3 has one end electrically coupled to the other end of the resistance element R3 and the other end electrically coupled to the terminal Tn2.

The capacitor C1 and the resistance element R4 function as a high-pass filter (HPF) which allows high-frequency components which are equal to or higher than a cut-off frequency in the driving signal COMa to pass. Note that the cut-off frequency of the HPF is set to approximately 9 MHz, for example. Furthermore, the resistance element R3 and the capacitor C2 function as a low-pass filter (LPF) which allows low-frequency components which are equal to or lower than a cut-off frequency in the driving signal COMa to pass. Note that the cut-off frequency of the LPF is set to approximately 160 MHz, for example. According to this embodiment, in the BPF 44, the cut-off frequency of the HPF is set lower than the cut-off frequency of the LPF. Therefore, the BPF 44 allows a frequency component in a certain band which is equal to or higher than the cut-off frequency of the HPF and which is equal to or lower than the cut-off frequency of the LPF to pass. Furthermore, since the BPF 44 includes the capacitor C3, and therefore, a signal generated by cutting a direct current component of the driving signal COMa in a certain band which passes the HPF and the LPF is fed back to the terminal Tn2.

The driving signal generation circuit 4a generates the driving signal COMa by smoothing the amplified signal Az in the node Nd using the smoothing section 42. The driving signal COMa is integrated and subtracted by the integration attenuator 412 and is fed back to the subtracter 404. Accordingly, self-oscillation is performed in a frequency determined by a delay of the feedback which is a sum of a delay in the smoothing section 42 and a delay in the integration attenuator 412 and a feedback transmission function.

Note that the delay amount of a feedback path through the terminal Tn1 is large, and therefore, when the feedback only through the terminal Tn1 is performed, a frequency of self-oscillation may not be increased to a degree that accuracy of a waveform of the driving signal COMa is sufficiently secured. On the other hand, in this embodiment, a path for feedback of a high-frequency component of the driving signal COMa through the terminal Tn2 is formed separately from the path through the terminal Tn1, and therefore, a delay in the driving signal generation circuit 4a may be reduced as a whole. Specifically, in this embodiment, a frequency of the signal As generated by adding the signal Ay which is a high-frequency component of the driving signal COMa to the signal Ab is higher than that in the configuration in which the path through the terminal Tn2 does not exist. Therefore, the accuracy of the driving signal COMa may be sufficiently ensured.

For example, in this embodiment, a frequency of the self-oscillation, that is, a frequency of the modulated signal Ms is included in a range equal to or larger than 1 MHz and equal to or smaller than 8 MHz. Since the modulated signal Ms has such a frequency, the accuracy of the waveform of the driving signal COMa may be sufficiently secured and suppression of a switching loss in the transistors TrH and TrL may be both realized.

Note that the modulated signal Ms of this embodiment is merely an example, and any signal may be used as the modulated signal as long as the signal drives the transistors TrH and TrL in accordance with the waveform specifying signal DCOMa. Specifically, the modulated signal is not limited to the modulated signal Ms which is a modulated signal in a narrow sense, and includes a signal generated by inverting a logic level of the modulated signal Ms and a signal in which an output timing is controlled so that the transistors TrH and TrL are not simultaneously turned on.

A configuration of the driving signal generation circuit 4a is not limited to the example of FIG. 8. For example, the configuration in which the gate driver 430 is omitted in the modulator 40 may be determined as a "modulation section" which generates a modulated signal by performing pulse modulation on a signal which specifies a waveform of a driving signal. Furthermore, although the digital waveform specifying signal DCOMa is illustrated as an example of the signal which specifies a waveform of the driving signal COMa in this embodiment, any signal may be employed as long as the signal which specifies a waveform of the driving signal COMa specifies a target value for generation of the driving signal COMa. For example, the analog signal Aa may be the signal which specifies a waveform of the driving signal COMa. When the signal Aa is the signal which specifies a waveform of the driving signal COMa, the "modulation section" which generates a modulated signal by performing pulse modulation on a signal which specifies a waveform of the driving signal may not include the DAC 402.

As described above, in this embodiment, the amplifier 41 included in the driving signal generation circuit 4 includes the transistors TrH and TrL coupled to each other in series between the voltage line to which the voltage Vh which is higher than the ground voltage is supplied and the grounding conductor to which the ground voltage is supplied. The transistors TrH and TrL are exclusively turned on in accordance with the modulated signal Ms, and the node Nd which couples the transistors TrH and TrL to each other outputs the amplified signal Az. Furthermore, the amplifier 41 includes the transistor TrS having the drain electrode coupled to the gate electrode of the transistor TrL and the source electrode coupled to the grounding conductor.

Therefore, in this embodiment, the current Iss1 which is supplied to the parasitic capacitance Cgd of the transistor TrL may be branched to the current Iss2 to be supplied to the parasitic capacitance Cgd of the transistor TrS and the current Iss3 to be supplied to the parasitic capacitance Cgs of the transistor TrL. By this, an amount of rise of the voltage of the gate electrode of the transistor TrL may be reduced. Consequently, occurrence of the self turn-on of the transistor TrL may be suppressed. Specifically, power consumption of the driving signal generation circuit 4 may be reduced.

Furthermore, when the self turn-on occurs in the transistor TrL, the self turn-on occurs in the transistor TrS since a voltage of the drain electrode of the transistor TrS coupled to the gate electrode of the transistor TrL rises. In this case, since the transistor TrS is turned on, a voltage of the gate electrode of the transistor TrL coupled to the drain electrode of the transistor TrS is changed to the ground voltage. Specifically, the transistor TrL is maintained in an Off state. Consequently, occurrence of the self turn-on of the transistor TrL may be suppressed and supply of through-current to the transistor TrL may be suppressed. That is, power consumption of the driving signal generation circuit 4 may be reduced.

Accordingly, in this embodiment, even when high performance of the transistors TrH and TrL is realized to realize high-speed switching of the amplifier 41, power consumption of the driving signal generation circuit 4 may be reduced without improving performance of the gate driver 430. Specifically, in this embodiment, reduction of a loss of the driving signal generation circuit 4 and high-speed switching may be realized without improving the performance of the gate driver 430 in accordance with the high performance of the transistor Tr.

Furthermore, when the transistors TrL and TrS are included in the same package, a parasitic inductance generated in a line between the transistors TrL and TrS may be reduced when compared with a configuration in which each of the transistors TrL and TrS is realized by a discrete circuit. Consequently, occurrence of the self turn-on of the transistor TrL may be suppressed when compared with the configuration in which each of the transistors TrL and TrS is realized by a discrete circuit.

Even when the transistors TrL and TrS are formed on the same semiconductor substrate, a parasitic inductance generated in the line between the transistors TrL and TrS may be reduced when compared with the configuration in which each of the transistors TrL and TrS is realized by a discrete circuit. Consequently, occurrence of the self turn-on of the transistor TrL may be reduced when compared with the configuration in which each of the transistors TrL and TrS is realized by a discrete circuit.

Furthermore, when the threshold voltage of the transistor TrS is equal to or smaller than the threshold voltage of the transistor TrL, a response speed of the transistor TrS may become higher than that of the transistor TrL, and therefore, the self turn-on is likely to occur in the transistor TrS. Since the self turn-on is likely to occur in the transistor TrS, capability of the transistor TrL for suppressing occurrence of the self turn-on may be improved.

Furthermore, when a capacitance value of the input capacitance Ciss of the transistor TrS is equal to or smaller than that of the input capacitance Ciss of the transistor TrL, the response speed of the transistor TrS may be increased to be equal to or larger than the transistor TrL, and therefore, the self turn-on may easily occur in the transistor TrS.

Furthermore, when a gate charge amount of the transistor TrS is equal to or smaller than that of the transistor TrL, a response speed of the transistor TrS may be increased to be higher than that of the transistor TrL, and therefore, the self turn-on is likely to occur in the transistor TrS.

Furthermore, since the gate electrode of the transistor TrS is coupled to the grounding conductor through the resistance element Rs, an unstable state of a voltage of the gate electrode of the transistor TrS may be suppressed. Furthermore, when a resistance value of the resistance element Rs is equal to or larger than an On resistance of the transistor TrGD, suppression of the instability of the voltage of the gate electrode of the transistor TrS and facilitation of occurrence of the self turn-on of the transistor TrS may be both realized.

The embodiment described above may be modified in various modes. Specifically, modifications will be described hereinafter as examples. Two or more modes which are arbitrarily selected from the examples below may be appropriately combined with each other as long as the modes do not contradict each other. A first modification will now be described.

Figure 9:
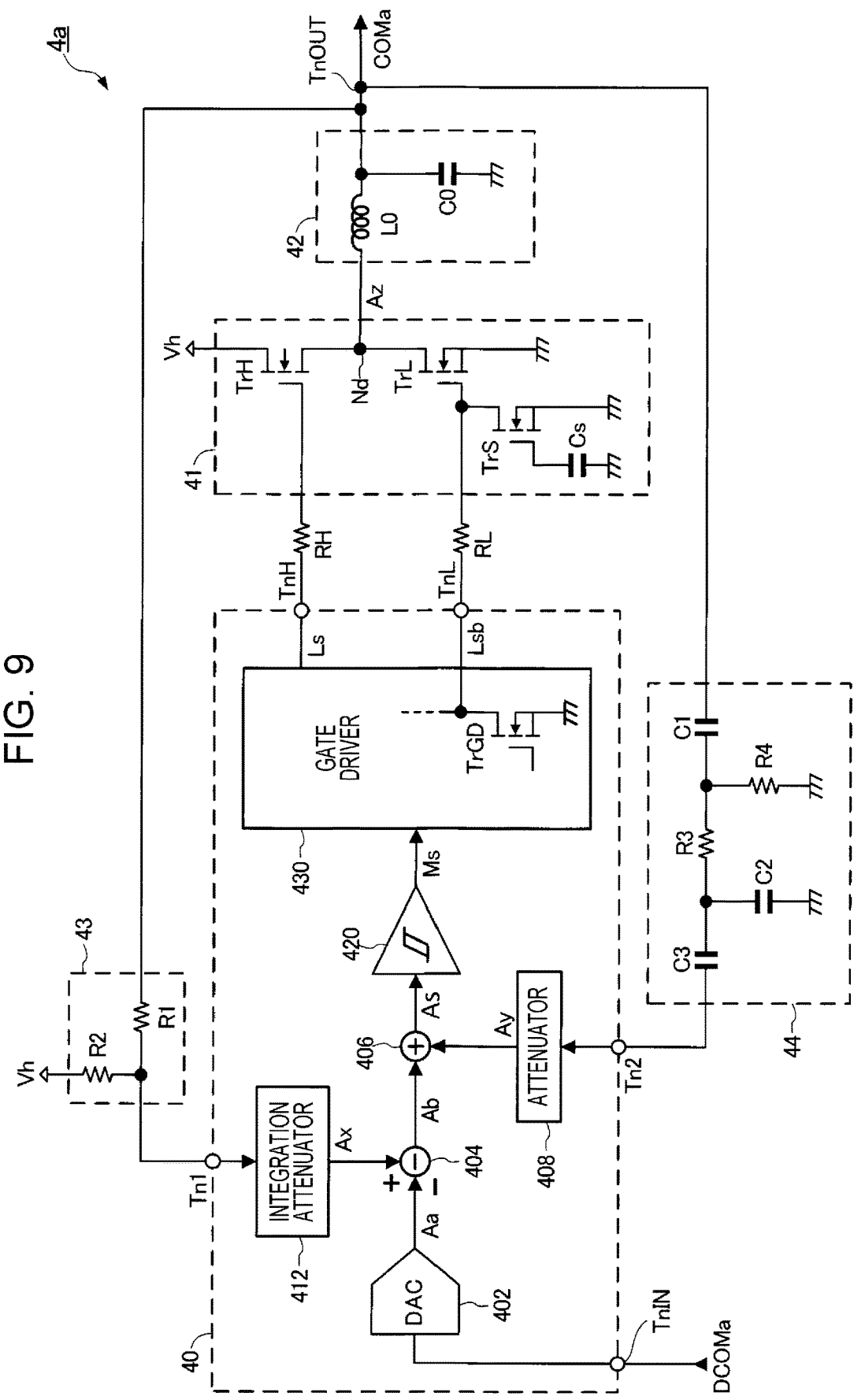
FIG. 9 is a diagram illustrating a configuration of a driving signal generation circuit according to a first modification.

In the first modification, the amplifier 41 of the foregoing embodiment may include a capacitor Cs instead of the resistance element Rs as illustrated in FIG. 9. The capacitor Cs is an example of a "capacitance element" disposed between the gate electrode of the third transistor and the grounding conductor. FIG. 9 is a diagram illustrating a configuration of the driving signal generation circuit 4a according to the first modification. The driving signal generation circuit 4a of FIG. 9 is the same as the driving signal generation circuit 4a of FIG. 8 except that the amplifier 41 includes the capacitor Cs instead of the resistance element Rs. Effects which are the same as those of the foregoing embodiment may be attained also in the first modification. For example, occurrence of the self turn-on of the transistor TrL may be suppressed and power consumption of the driving signal generation circuit 4 may be reduced also in the first modification. Furthermore, the gate electrode of the transistor TrS is coupled to the grounding conductor through the capacitor Cs, and therefore, instability of the voltage of the gate electrode of the transistor TrS may be suppressed.

In a second modification, the amplifier 41 according to the foregoing embodiment does not include the resistance element Rs. Specifically, the gate electrode of the transistor TrS may be in an open state. Effects which are the same as those of the foregoing embodiment may be attained also in the second modification. Note that, in the second embodiment, the voltage of the gate electrode of the transistor TrS may become unstable.

In a third modification, the transistor TrH included in the amplifier 41 in the foregoing embodiment may be a P-channel FET. Also in this case, occurrence of the self turn-on of the transistor TrL may be suppressed and power consumption of the driving signal generation circuit 4 may be reduced. Alternatively, the transistors TrH, TrL, and TrS may be P-channel FETs, for example. When the transistors TrH, TrL, and TrS are P-channel FETs, the transistor TrS is disposed between the gate electrode of the transistor TrH and the voltage line to which the voltage Vh is supplied. Also in this case, occurrence of the self turn-on of the transistor TrH may be suppressed and power consumption of the driving signal generation circuit 4 may be reduced. Next, an application example of the amplifier 41 will be described.

In the application example, the amplifier 41 according to the foregoing embodiment and the first to third modifications may be used other than generation of the driving signal COM for driving the ejection sections 33 included in the ink jet printer 1. For example, the amplifier 41 may be used in an apparatus other than the ink jet printer 1. In this case, the amplifier 41 corresponds to a "driving circuit". The gate signals Ls and Lsb are examples of an "input signal", and the driving signal COM is an example of an "output signal". Also in this application example, occurrence of the self turn-on of the transistor TrL may be suppressed and power consumption of the amplifier 41 may be reduced. Furthermore, a loss of the amplifier 41 may be reduced and high-speed switching may be realized without improving performance of a circuit which supplies a signal to the gate electrodes of the transistors TrH and TrL included in the amplifier 41.

What is claimed is:

1. A driving circuit generating a driving signal for driving an ejection section which ejects liquid, the driving circuit comprising:
   a modulator configured to generate a modulated signal by performing pulse modulation on a signal specifying a waveform of the driving signal;
   an amplifier configured to generate an amplified signal by amplifying the modulated signal; and
   a smoothing section configured to generate the driving signal by smoothing the amplified signal, wherein
   the amplifier includes
      first and second transistors coupled to each other in series between a voltage line to which a voltage which is higher than a ground voltage is supplied and a grounding conductor to which the ground voltage is supplied, and a third transistor having a drain electrode coupled to a gate electrode of the second transistor and having a source electrode and a gate electrode coupled to the grounding conductor, and the first and second transistors are exclusively set to an On state in accordance with the modulated signal, and the amplified signal is output from a node which couples the first and second transistors to each other.

2. The driving circuit according to claim 1, wherein a threshold voltage of the third transistor is equal to or smaller than a threshold voltage of the second transistor.

3. The driving circuit according to claim 1, wherein an input capacitance of the third transistor is equal to or smaller than an input capacitance of the second transistor.

4. The driving circuit according to claim 1, wherein a gate charge amount of the third transistor is equal to or smaller than a gate charge amount of the second transistor.

5. The driving circuit according to claim 1, wherein the gate electrode of the third transistor is coupled to the grounding conductor through a resistance element.

6. The driving circuit according to claim 5, wherein the modulator includes a fourth transistor which outputs a signal based on the modulated signal to a gate electrode of the second transistor, and a resistance value of the resistance element is equal to or larger than an On resistance of the fourth transistor.

7. The driving circuit according to claim 1, wherein the gate electrode of the third transistor is coupled to the grounding conductor through a capacitance element.

8. The driving circuit according to claim 1, wherein the second and third transistors are formed at the same semiconductor substrate.

9. A liquid ejection apparatus comprising:
the driving circuit according to claim 1; and
an ejection section configured to eject liquid by being driven by the driving signal.

10. A driving circuit comprising:
first and second transistors coupled to each other in series between a voltage line to which a voltage which is higher than a ground voltage is supplied and a grounding conductor to which the ground voltage is supplied; and
a third transistor having a drain electrode coupled to a gate electrode of the second transistor and having a source electrode and a gate electrode coupled to the grounding conductor,
wherein the first and second transistors are exclusively set to an On state in accordance with an input signal, and a signal is output from a node which couples the first and second transistors to each other.

* * * * *